(12) United States Patent
Huang et al.

(10) Patent No.: US 9,679,933 B2
(45) Date of Patent: Jun. 13, 2017

(54) IMAGE SENSORS AND METHODS OF FORMING THE SAME

(71) Applicant: VisEra Technologies Company Limited, Hsin-Chu (TW)

(72) Inventors: Tzu-Wei Huang, Zhubei (TW); Wei-Ko Wang, Taoyuan County (TW); Chi-Han Lin, Zhubei (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 278 days.

(21) Appl. No.: 14/507,315

(22) Filed: Oct. 6, 2014

(65) Prior Publication Data
US 2016/0099280 A1    Apr. 7, 2016

(51) Int. Cl.
*H01L 27/00* (2006.01)
*H01L 27/146* (2006.01)
*G02B 5/22* (2006.01)

(52) U.S. Cl.
CPC .......... *H01L 27/14621* (2013.01); *G02B 5/22* (2013.01); *H01L 27/1464* (2013.01); *H01L 27/14627* (2013.01); *H01L 27/14645* (2013.01); *H01L 27/14649* (2013.01); *H01L 27/14652* (2013.01); *H01L 27/14685* (2013.01)

(58) Field of Classification Search
CPC ............. H01L 27/146; H01L 27/14652; H01L 27/14627; H01L 27/14685
USPC ...... 250/208.1, 214.1; 257/432, 440; 438/70
See application file for complete search history.

(56) References Cited

U.S. PATENT DOCUMENTS

| | | | |
|---|---|---|---|
| 5,801,373 | A | 9/1998 | Oozu et al. |
| 2008/0251694 | A1 | 10/2008 | Tanimoto et al. |
| 2010/0102366 | A1 | 4/2010 | Lee et al. |
| 2010/0289885 | A1 | 11/2010 | Lu et al. |
| 2011/0001205 | A1 | 1/2011 | Sul et al. |
| 2011/0013055 | A1 | 1/2011 | Sul et al. |
| 2011/0317048 | A1 | 12/2011 | Bai et al. |
| 2015/0221691 | A1* | 8/2015 | Watanabe ............. H04N 5/332 348/164 |

FOREIGN PATENT DOCUMENTS

| | | |
|---|---|---|
| JP | 5-80213 A | 4/1993 |
| JP | 06-342146 A | 12/1994 |
| JP | 10-065135 | 3/1998 |

(Continued)

OTHER PUBLICATIONS

An Office Action from the corresponding Japanese application mailed May 23, 2016, 12 pages, JP 2015-051669.

(Continued)

*Primary Examiner* — Kevin Pyo
(74) *Attorney, Agent, or Firm* — Muncy, Geissler, Olds & Lowe, P.C.

(57) ABSTRACT

An image sensor is provided. The image sensor includes a red (R) pixel, a green (G) pixel, a blue (B) pixel and an infrared (IR) pixel, and R, G and B filters respectively disposed at the R, G and B pixels. The image sensor also includes an IR pass filter disposed at the IR pixel and an IR filter stacked with the R, G and B filters, wherein the IR filter cuts off at least IR light with a specific wavelength. Furthermore, a method of forming an image sensor is also provided.

14 Claims, 8 Drawing Sheets

(56) References Cited

FOREIGN PATENT DOCUMENTS

| JP | 2007189376 A | 7/2007 |
|---|---|---|
| JP | 2008008700 A | 1/2008 |
| JP | 2012137728 A | 7/2012 |
| JP | 2013115625 A | 6/2013 |
| JP | 2014083189 A | 5/2014 |
| WO | WO2015159651 A1 | 10/2015 |

OTHER PUBLICATIONS

Japanese Office Action dated Feb. 6, 2017, as issued in corresponding Japan Patent Application No. 2015-051669 (with English translation—18 pages).

* cited by examiner

IMAGE SENSORS AND METHODS OF FORMING THE SAME

CROSS REFERENCE TO RELATED APPLICATIONS

This application is related to the following co-pending commonly assigned patent application U.S. Ser. No. 14/507,339 filed on Oct. 6, 2014, the entire contents of which is hereby incorporated by reference.

BACKGROUND

Field of the Invention

The invention relates to an image sensor and more particularly to an image sensor capable of collecting a pure infrared (IR) signal for 3D detection imaging application, ex. Time-of-flight (ToF) technology.

Description of the Related Art

Currently, time-of-flight (ToF) technology has been used extensively in modern industries to provide three dimensional (3D) imaging by using a complementary metal-oxide semiconductor (CMOS) pixel array together with a modulated light source. 3D TOF cameras are used for many different applications, for example, profile inspection of manufactured goods, computer-aided design (CAD) verification, geographic surveying and object imaging.

A 3D ToF camera works by illuminating the scene with a modulated light source, and observing the reflected light. The phase shift between the illumination and the reflection is measured and translated into distance. Typically, the illumination is from a solid-state laser or a light-emitting diode (LED) operating in the near-infrared range of about 850 nm, invisible to the human eye. An imaging sensor designed to respond to the same spectrum of the modulated light source receives the light and converts the photonic energy to electrical current to obtain distance (depth) information of the scene.

However, the light entering the imaging sensor has an ambient component and a reflected component. The distance (depth) information is only embedded in the reflected component. Thus, the ambient component reduces the signal-to-noise ratio (SNR) of the distance (depth) information.

BRIEF SUMMARY

The disclosure provides image sensors with red (R), green (G) and blue (B) pixels and infrared (IR) pixels together in a single image sensor. In the image sensors, R, G and B signals are obtained from photodiodes at the R, G and B pixels, and an IR signal is obtained from photodiodes at the IR pixels. However, when IR light is received by the photodiodes at the R, G and B pixels, an IR signal noise will be generated from the photodiodes at the R, G and B pixels. The image sensors of the disclosure have an IR filter disposed at the R, G and B pixels to avoid the IR signal noise being generated from the photodiodes at the R, G and B pixels. Therefore, the image sensors of the disclosure can obtain a pure IR signal collection from the photodiodes at the IR pixels without IR signal noise or with a lower IR signal noise onto R, G and B pixels. A signal-to-noise ratio (SNR) of distance (depth) information of the image sensors is thereby enhanced.

According to some embodiments, an image sensor is provided. The image sensor comprises a red (R) pixel, a green (G) pixel, a blue (B) pixel and an infrared (IR) pixel; R, G and B filters respectively disposed at the R, G and B pixels; an IR pass filter disposed at the IR pixel; and an IR filter stacked with the R, G and B filters, wherein the IR filter cuts off at least IR light with a specific wavelength.

According to some embodiments, a method of forming an image sensor is provided. The method comprises providing a semiconductor substrate containing a plurality of photodiodes formed therein, wherein each of the photodiodes is disposed at one pixel of a red (R) pixel, a green (G) pixel, a blue (B) pixel and an infrared (IR) pixel; forming an IR filter material layer above the semiconductor substrate; removing a portion of the IR filter material layer at the IR pixel to form an IR filter, wherein the IR filter cuts off at least IR light with a specific wavelength and the IR filter has an opening at the IR pixel; forming R, G and B filters respectively at the R, G and B pixels; and forming an IR pass filter in the opening of the IR filter at the IR pixel.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION

The following description is the contemplated mode of carrying out the disclosure. This description is made for the purpose of illustrating the general principles of the disclosure and should not be taken in a limiting sense. The scope of the disclosure is best determined by reference to the appended claims.

Figure 1:
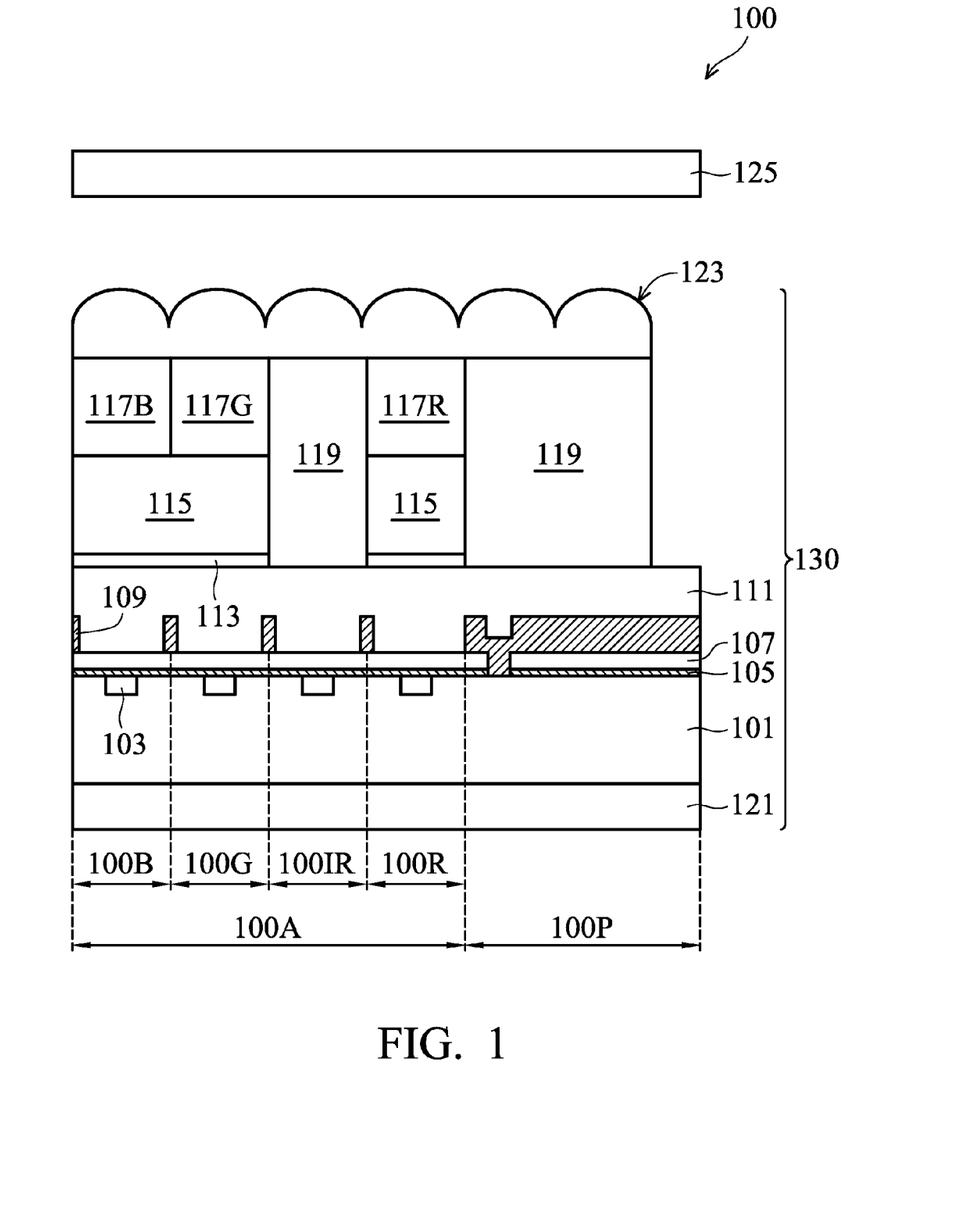
FIG. 1 is a schematic cross section of a portion of an image sensor according to some embodiments.

Referring to FIG. 1, a cross section of a portion of a backside illumination (BSI) image sensor 100 according to some embodiments is shown. The image sensor 100 has multiple pixels of red (R) pixels 100R, green (G) pixels 100G, blue (B) pixels 100B and infrared (IR) pixels 1001R arranged in order to form an array in a pixel array area 100A. A peripheral area 100P of the image sensor 100 surrounds the pixel array area 100A. The image sensor 100 includes a semiconductor substrate 101 containing multiple photodiodes 103 formed therein. Each of the photodiodes 103 is disposed at one pixel of the red (R) pixels 100R, the green (G) pixels 100G, the blue (B) pixels 100B and the infrared (IR) pixels 100IR.

The BSI image sensor 100 further includes a wiring layer 121 formed on a surface of the semiconductor substrate 101. The wiring layer 121 is disposed under the photodiodes 103. The wiring layer 121 consists of several metal layers and several dielectric layers disposed between the metal layers. The metal layers and the dielectric layers can be formed by semiconductor integrated circuit processing technology as known in the art. In order to simplify the diagram, the metal layers and the dielectric layers are not depicted in FIG. 1. The wiring layer 121 includes multiple circuit areas and each of the circuit areas corresponds to one photodiode 103. In some embodiments, the image sensor 100 can be a CMOS image sensor (CIS) with the R, G, B and IR pixels integrated together in a single image sensor.

In some embodiments, the image sensor 100 further includes a high dielectric-constant film 105 formed on another surface of the semiconductor substrate 101 and disposed above the photodiodes 103. In addition, a passivation film 107 is formed on the high dielectric-constant film 105. The image sensor 100 also includes a light-shielding partition layer 109 formed on the passivation film 107. The light-shielding partition layer 109 has a plurality of partitions disposed between two adjacent pixels of the image sensor 100 to avoid cross-talk. Also, the light-shielding partition layer 109 has a plurality of openings between the partitions. Furthermore, the image sensor 100 includes another passivation film 111 covering the light-shielding partition layer 109 and filling in the openings of the light-shielding partition layer 109.

The image sensor 100 includes an R filter 117R, a G filter 117G and a B filter 117B disposed at the R, G and B pixels, 100R, 100G and 100B, respectively. The image sensor 100 further includes an IR filter 115 disposed at the R, G and B pixels, 100R, 100G and 100B to stack with the R, G and B filters, 117R, 117G and 117B. According to the embodiments of the disclosure, the IR filter 115 cuts off at least IR light with a specific wavelength.

In some embodiments, the IR filter 115 can be a selective IR filter which only cuts off IR light with a specific wavelength. In some other embodiments, the IR filter 115 can be an IR cut-off filter which can cut off IR light with wavelengths of the entire IR band. According to the embodiments of the disclosure, the R, G and B filters, 117R, 117G and 117B combined with the IR filter 115 allows R, G and B lights with wavelengths in the visible band to be transmitted through and cuts off at least IR light with a specific wavelength. The specific wavelength of the IR light cut off by the IR filter 115 will be illustrated by the following description.

In the embodiment of FIG. 1, the R, G and B filters, 117R, 117G and 117B are disposed on the IR filter 115. The image sensor 100 further includes a patterned buffer layer 113 formed on the passivation film 111 at the R, G and B pixels, 100R, 100G and 100B. The patterned buffer layer 113 has an opening at the IR pixel 100IR. The IR filter 115 is formed on the patterned buffer layer 113. The IR filter 115 has also an opening at the IR pixel 100IR. In the embodiment of FIG. 1, the patterned buffer layer 113 can be used as an etching stop layer for the formation of the IR filter 115.

The image sensor 100 further includes an IR pass filter 119 disposed at the IR pixel 100IR. The IR pass filter 119 allows IR light with wavelengths in the IR band to be transmitted through. The IR pass filter 119 is formed on the first passivation layer 111 at the IR pixel 100IR. Also, the IR pass filter 119 fills in the openings of the patterned buffer layer 113, the IR filter 115 and the R, G and B filters, 117R, 117G and 117B at the IR pixel 100IR. The IR pass filter 119 has a top surface higher than a top surface of the IR filter 115. In some embodiments, the top surface of the IR pass filter 119 is level with a top surface of the R, G and B filters, 117R, 117G and 117B. In some other embodiments, the top surface of the IR pass filter 119 may be lower than or higher than a top surface of the R, G and B filters, 117R, 117G and 117B. As shown in FIG. 1, the IR pass filter 119 is further disposed in the peripheral area 100P of the image sensor 100. The IR pass filter 119 in the peripheral area 100P has a light-shielding effect and can be used as a light-shielding element.

As shown in FIG. 1, the image sensor 100 further includes a microlens structure 123 disposed on the R, G and B filters, 117R, 117G and 117B and the IR pass filter 119. In addition, the image sensor 100 includes a double band pass filter 125 disposed above the microlens structure 123. The double band pass filter 125 allows a light with a first wavelength in the visible band and a light with a second wavelength of a specific IR band to be transmitted through. The second wavelength of the specific IR band will be illustrated later. The elements of the image sensor 100 disposed under the double band pass filter 125 can be referred to as an image-sensor device unit 130.

Figure 2:
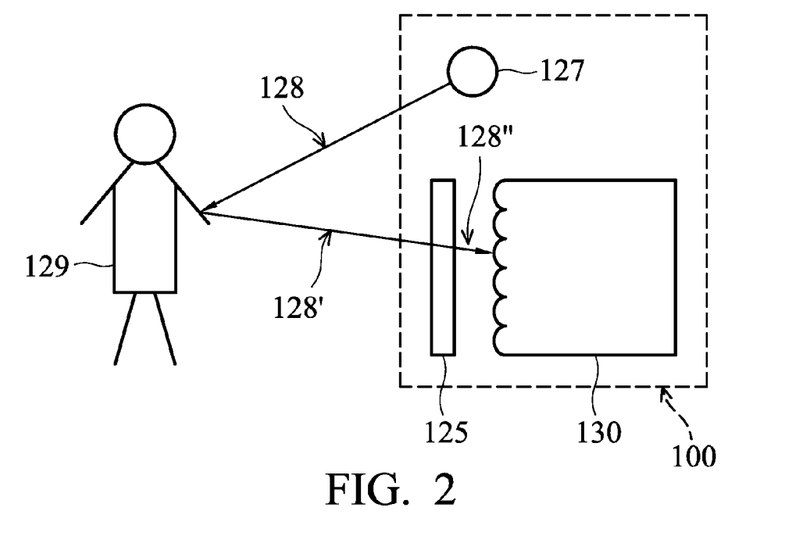
FIG. 2 is a diagram illustrating the configuration of an image sensor for imaging an object according to some embodiments.

Referring to FIG. 2, a diagram illustrating the configuration of the image sensor 100 for imaging an object 129 according to some embodiments of the disclosure is shown. As shown in FIG. 2, the image sensor 100 further includes a light source unit 127 configured to radiate IR light 128 with a wavelength of a specific band onto the object 129. In some embodiments, the wavelength of the specific band of the IR light 128 of the light source unit 127 is consistent with the specific wavelength of the IR light cut off by the IR filter 115 of the image sensor 100 of FIG. 1. Moreover, the wavelength of the specific band of the IR light 128 of the light source unit 127 is also consistent with the second wavelength of the specific IR band of the double band pass filter 125. In some embodiments, the light source unit 127 can be a LED operating in the near-infrared range of about 850 nm. Thus, the specific wavelength of the IR light cut off by the IR filter 115 can be about 850 nm. Also, the second wavelength of the specific IR band of the double band pass filter 125 can be about 850 nm.

As shown in FIG. 2, an IR light 128' reflected by the object 129 is transmitted through the double band pass filter 125 to the image-sensor device unit 130. Because the second wavelength of the specific IR band of the double band pass filter 125 is consistent with the wavelength of the specific band of the IR light 128 of the light source unit 127, an IR light 128" after being transmitted through the double band pass filter 125 to the image-sensor device unit 130 also has a wavelength that is the same as the wavelength of the IR light 128 of the light source unit 127.

Figure 3:
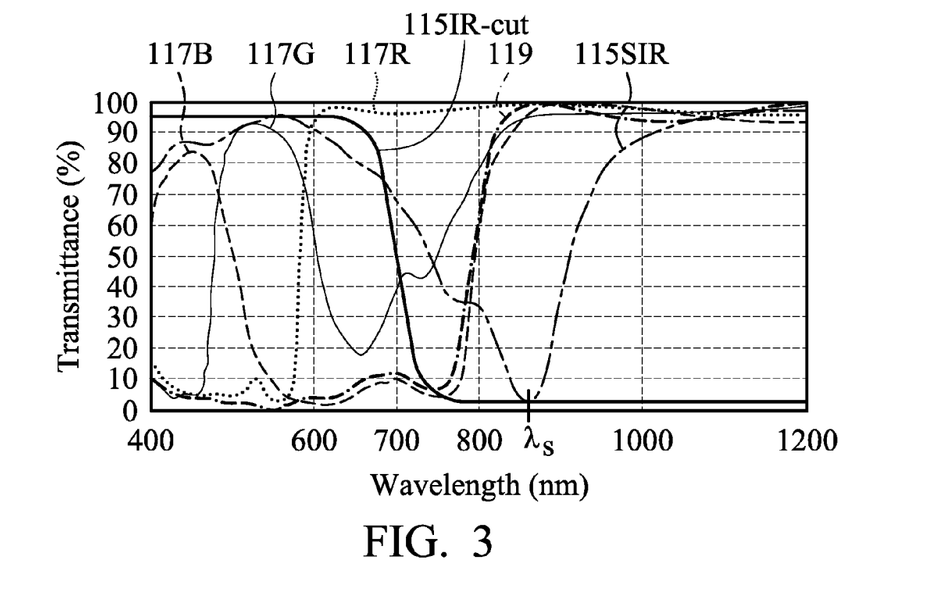
FIG. 3 is a graph of transmittance against wavelength to illustrate the optical characteristics of an R filter, a G filter, a B filter, an IR pass filter, a selective IR filter and an IR cut-off filter, respectively, of an image sensor according to some embodiments.

Referring to FIG. 1 again, the IR light 128" can be transmitted through the IR pass filter 119 and received by the photodiode 103 at the IR pixel 100IR to obtain an IR signal for a depth information of the object 129. Meanwhile, referring to FIG. 3, it is a graph of transmittance against wavelength to illustrate the optical characteristics of an R filter 117R, a G filter 117G, a B filter 117B, an IR pass filter 119, a selective IR filter 115SIR and an IR cut-off filter 115IR-cut, respectively, of an image sensor 100 according to some embodiments of the disclosure. As shown in FIG. 3, visible light can pass through the R, G and B filters, 117R, 117G and 117B to produce R, G and B signals in a visible band. Moreover, IR light with a wavelength of an IR band from 700 nm to 1200 nm can also pass through the R, G and B filters, 117R, 117G and 117B with a high transmittance. Therefore, some R, G and B signals are produced at the wavelength of the IR band, such as from 700 nm to 1200 nm. Thus, the IR light 128" can also be transmitted through the R, G and B filters, 117R, 117G and 117B. If the IR light 128" is received by the photodiodes 103 at the R, G and B pixels, an IR signal noise will be generated.

According to the embodiments of the disclosure, the IR filter 115, which can cut off at least IR light with a specific wavelength the same as the wavelength of the IR light 128 of the light source unit 127, is stacked with the R, G and B filters, 117R, 117G and 117B. Thus, the IR light 128" will be cut off by the IR filter 115. None of IR light or a low transmittance of IR light is received by the photodiodes 103 at the R, G and B pixels. As a result, it can prevent an IR signal noise from being generated in the image sensor 100. In other words, the image sensor 100 can collect a pure IR signal.

Although it is not shown in FIG. 2, visible light from natural light or another light source is also reflected by the object 129 to produce reflected visible light. The reflected visible light transmits through the double band pass filter 125 to the image-sensor device unit 130. Then, the reflected visible light will be transmitted through the R, G and B filters, 117R, 117G and 117B and received by the photodiode 103 at the R, G and B pixels, 100R, 100G and 100B for obtain R, G and B signals of a color image information of the object 129.

In the embodiments, the IR filter 115 stacked with the R, G and B filters, 117R, 117G and 117B. The IR filter 115 can allow a light with wavelengths in the visible band to be transmitted through and cuts off a light with a specific wavelength in the IR band. In some embodiments, the IR filter 115 is a selective IR filter 115SIR of FIG. 3, which cuts off only the light with a specific wavelength λs of an IR band. The specific wavelength λs of the selective IR filter 115SIR is consistent with the wavelength of the IR light 128 of the light source unit 127, for example, about 850 nm. In some other embodiments, the IR filter 115 is an IR cut-off filter 115IR-cut of FIG. 3, which cut off a light with wavelengths of the entire IR band, for example from 700 nm to above 1200 nm. Thus, the R, G and B filters, 117R, 117G and 117B combined with the IR filter 115 allows a light with wavelengths in the visible band to be transmitted through and cuts off IR light with the specific wavelength λs. As a result, there is no or a lower IR signal noise generated from the photodiodes 103 at the R, G and B pixels.

As shown in FIG. 3, in some embodiments, the IR pass filter 119 allows IR light with wavelengths in an IR band, for example from 800 nm to above 1200 nm, to be transmitted through. An IR signal is obtained only from the photodiode 103 at the IR pixel. Thus, the image sensors 100 according to the embodiments of the disclosure can achieve a pure IR signal collection.

Figure 4A:
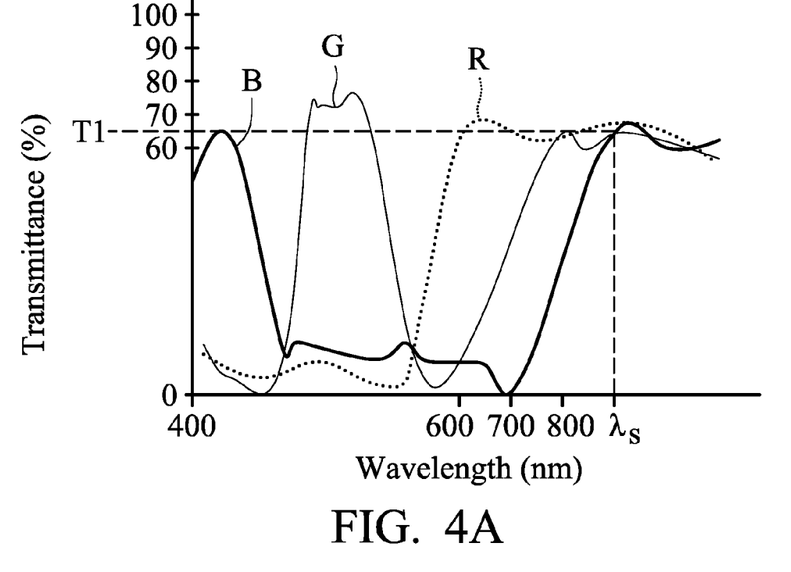
FIG. 4A is a graph of transmittance against wavelength to illustrate R, G and B signals obtained from photodiodes at R, G and B pixels, respectively, of an image sensor without an IR filter at the R, G and B pixels.

FIG. 4A is a graph of transmittance against wavelength to illustrate R, G and B signals obtained from photodiode at R, G and B pixels of an image sensor without an IR filter at the R, G and B pixels. As shown in FIG. 4A, the R, G and B signals have a high transmittance T1 at a specific wavelength λs of an IR band. The specific wavelength λs is consistent with a wavelength of a specific band of IR light of a light source unit. The high transmittance T1 at the specific wavelength λs of an IR band will be received by the photodiodes at the R, G and B pixels and cause an IR signal noise. The transmittance T1 may be in a range of about 95% to about 15%.

Figure 4B:
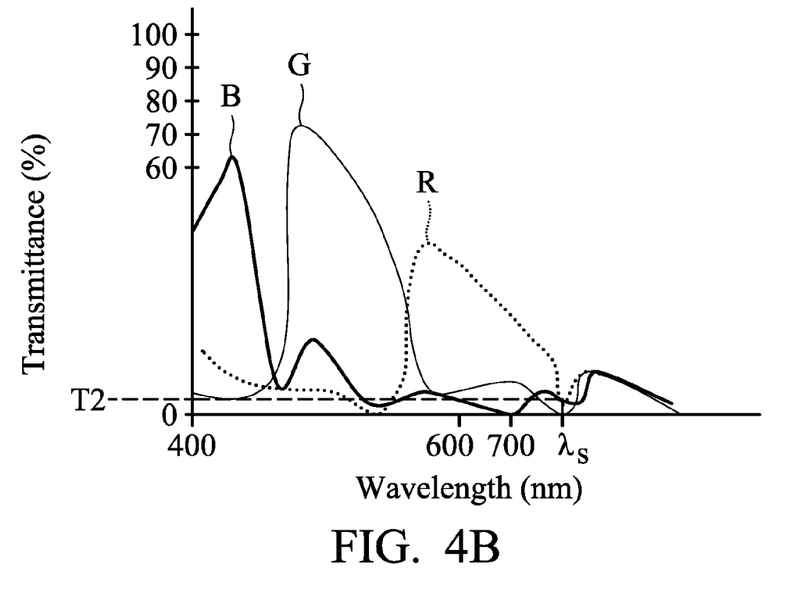
FIG. 4B is a graph of transmittance against wavelength to illustrate R, G and B signals obtained from photodiodes at R, G and B pixels, respectively, of an image sensor with an IR filter at the R, G and B pixels according to some embodiments.

FIG. 4B is a graph of transmittance against wavelength to illustrate R, G and B signals obtained from photodiode at R, G and B pixels of an image sensor 100 according to some embodiments of the disclosure which has an IR filter 115 at the R, G and B pixels. As shown in FIG. 4B, there is a low transmittance T2 at a specific wavelength λs of an IR band. The specific wavelength λs may be consistent with the wavelength of the specific band of the IR light 128 of the light source unit 127 of FIG. 2. The IR filter 115 cuts off IR light passing through the R, G and B filters at the R, G and B pixels. Therefore, the photodiodes at the R, G and B pixels will receive no transmittance or a low transmittance T1 of IR light. None of IR signal noise or a low IR signal noise generated from the photodiodes at the R, G and B pixels of the image sensor 100 is achieved. In some embodiments, the transmittance T2 may be in a range of about 0% to about 2%.

Figure 5:
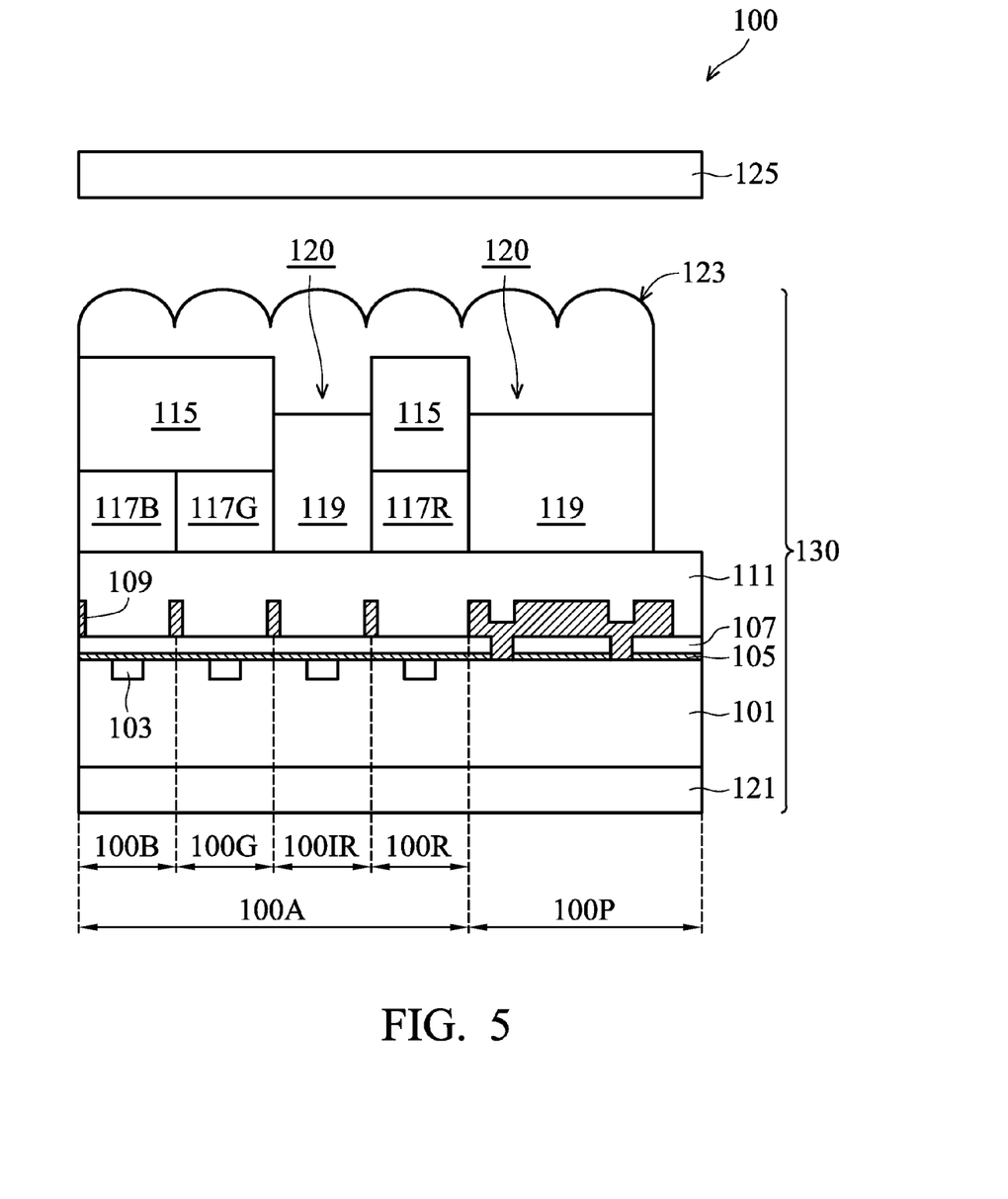
FIG. 5 is a schematic cross section of a portion of an image sensor according to some other embodiments.

Referring to FIG. 5, a cross section of a portion of a backside illumination (BSI) image sensor 100 according to some other embodiment of the disclosure is shown. One difference between the image sensors 100 of FIG. 5 and FIG. 1 is that the R, G and B filters, 117R, 117G and 117B of FIG. 5 are disposed underneath the IR filter 115. In addition, there is no patterned buffer layer formed on the passivation layer 111 of FIG. 5. In the embodiment of FIG. 5, the IR pass filter 119 is disposed at the IR pixel 100IR and fills in the opening of the R, G and B filters, 117R, 117G and 117B. In some embodiments, as shown in FIG. 5, the IR pass filter 119 has a top surface lower than a top surface of the IR filter 115, and a cavity 120 is formed on the IR pass filter 119. The material of forming the microlens structure 123 also fills in the cavity 120 formed on the IR pass filter 119. In some other embodiments, the top surface of the IR pass filter 119 may be level with or higher than the top surface of the IR filter 115, depending on the thickness of the IR filter 115 required for cutting off IR light.

In the embodiment of FIG. 5, the IR filter 115, disposed on the R, G and B filters, 117R, 117G and 117B, firstly cuts off at least IR light with a specific wavelength and allows a light with wavelengths in the visible band to be transmitted through. The specific wavelength of the IR light cut off by the IR filter 115 is consistent with the wavelength of the specific band of the IR light 128 from the light source unit 127 of the image sensor 100 as shown in FIG. 2. Therefore, none of IR signal noise or a low IR signal noise is generated from the photodiodes 103 at the R, G and B pixels of the image sensor 100. The image sensor 100 can collect a pure IR signal from the photodiode 103 at the IR pixel 100IR without noise.

Figure 6A:
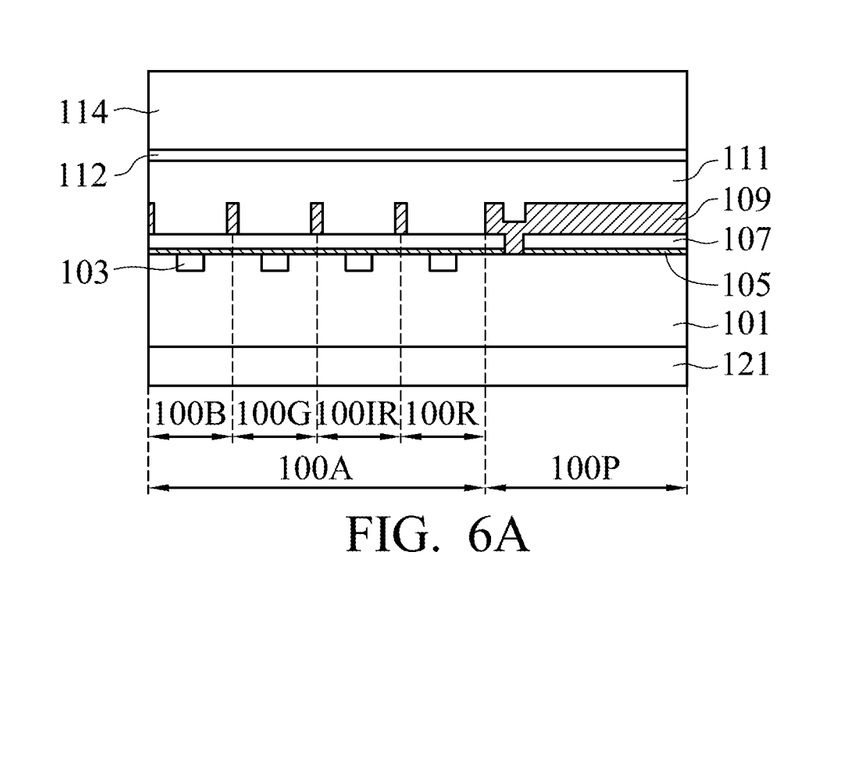
FIGS. 6A-6D are schematic cross sections to illustrate several intermediate stages of fabricating the image sensor of FIG. 1 according to some embodiments.

FIGS. 6A-6D are cross sections to illustrate several intermediate stages of fabricating the image sensor 100 of FIG. 1 according to some embodiments. Referring to FIG. 6A, a semiconductor substrate 101 containing multiple photodiodes 103 formed therein is provided. Each of the photodiodes 103 is disposed at one pixel of a red (R) pixel 100R, a green (G) pixel 100G, a blue (B) pixel 100B and an infrared (IR) pixel 100IR. A wiring layer 121 is formed on a surface of the semiconductor substrate 101 and disposed under the photodiodes 103. The wiring layer 121 consists of several metal layers and several dielectric layers, which can be formed by semiconductor integrated circuit processing technology as known in the art.

A high dielectric-constant film 105 is formed on another surface of the semiconductor substrate 101 and disposed above the photodiodes 103. A passivation film 107 is formed on the high dielectric-constant film 105. A light-shielding partition layer 109 is formed on the passivation film 107. The light-shielding partition layer 109 has a plurality of partitions disposed between two adjacent pixels of the image sensor 100 to avoid cross-talk. In addition, another passivation layer 111 is formed to cover the light-shielding partition layer 109 and filling in the openings of the light-shielding partition layer 109.

As shown in FIG. 6A, a buffer material layer 112 is formed on the passivation film 111. The buffer material layer 112 can be formed by a coating process on the passivation layer 111. Next, an IR filter material layer 114 is formed over the buffer material layer 112 in the pixel array area 100A. The IR filter material layer 114 can be formed by a coating process.

Figure 6B:
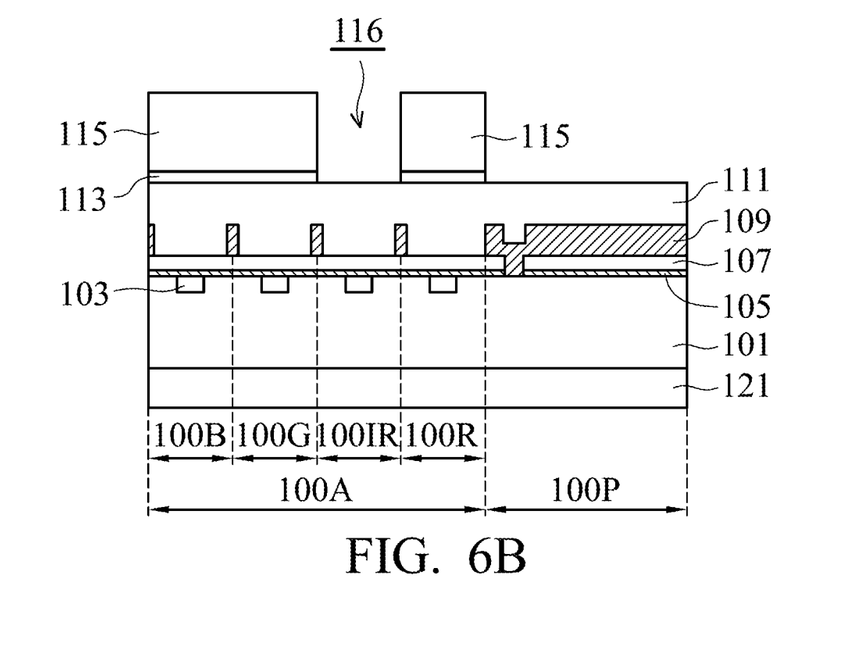

Referring to FIG. 6B, a portion of the IR filter material layer 114 at the IR pixel 100IR is removed by an etching process using the buffer material layer 112 as an etching stop layer to form an IR filter 115. Then, a portion of the buffer material layer 112 at the IR pixel 100IR is removed by another etching process to form a patterned buffer layer 113. Thus, an opening 116 is formed in the patterned buffer layer 113 and the IR filter 115. As stated in the above description, the IR filter 115 cuts off at least IR light with a specific wavelength.

Figure 6C:
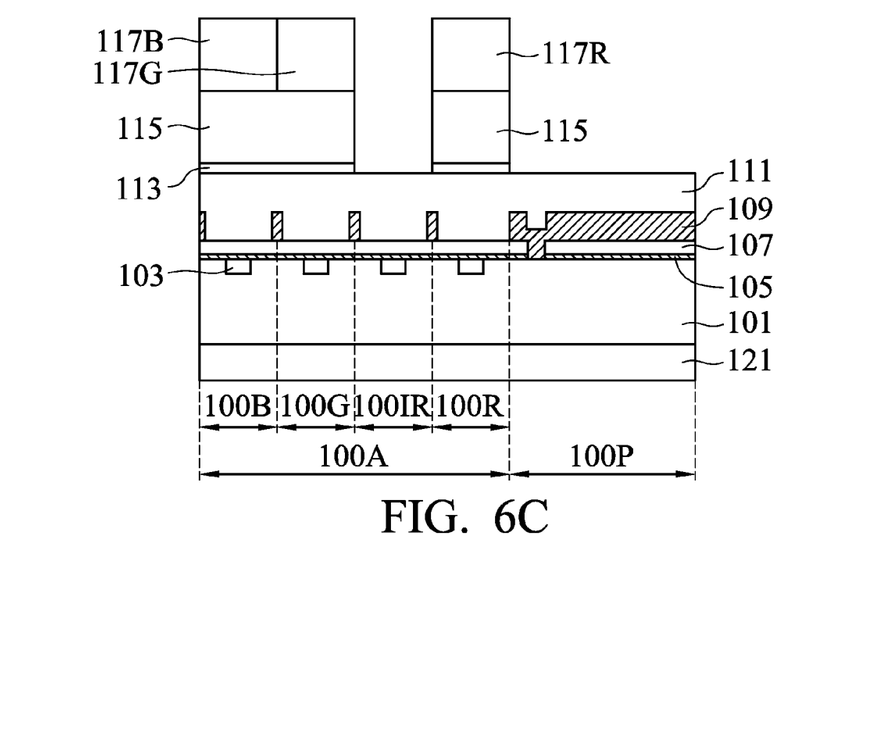

Referring to FIG. 6C, an R filter 117R, a G filter 117G and a B filter 117B are formed on the IR filter 115 at the R, G and B pixels, 100R, 100G and 100B, respectively. In some embodiments, the R, G and B filters, 117R, 117G and 117B can be formed by a coating and photolithography process.

Figure 6D:
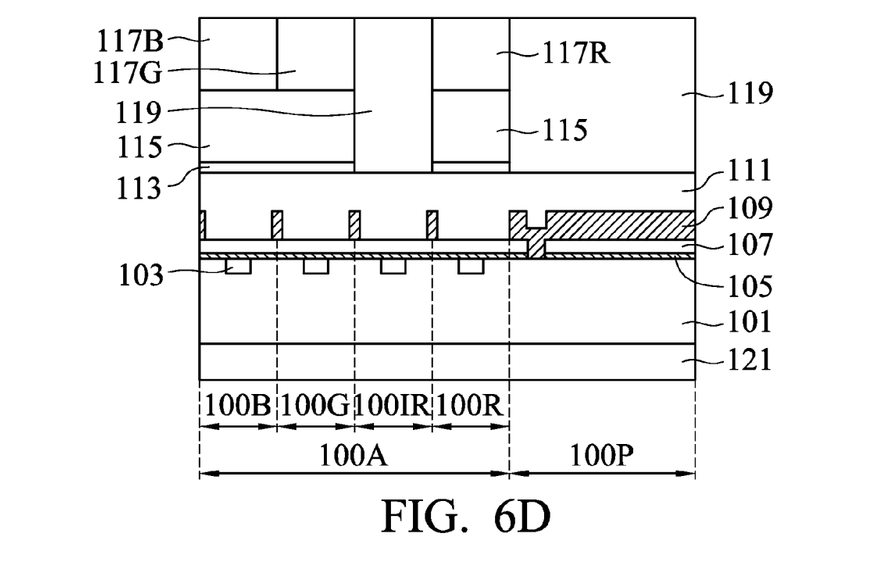

Referring to FIG. 6D, an IR pass filter 119 is formed in the opening 112 and 116 of the IR filter 115 and on the passivation film 111. Moreover, the IR pass filter 119 is also formed on the passivation film 111 in the peripheral area 100P. In some embodiments, the IR pass filter 119 is formed by a coating process to have a top surface level with the top surface of the R, G and B filters, 117R, 117G and 117B. In some other embodiments, the IR pass filter 119 may be formed to have a top surface lower or higher than a top surface of the R, G and B filters, 117R, 117G and 117B.

Next, a microlens structure 123 is formed on the R, G and B filters, 117R, 117G and 117B and the IR pass filter 119. Then, a double band pass filter 125 is provided to be disposed above the microlens structure 123 to complete the image sensor 100 of FIG. 1.

Figure 7A:
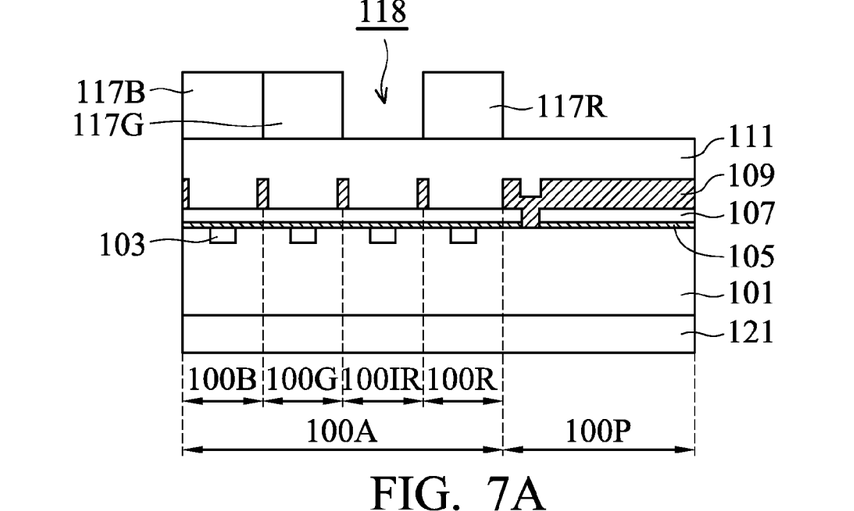
FIGS. 7A-7D are schematic cross sections to illustrate several intermediate stages of fabricating the image sensor of FIG. 5 according to some embodiments.

FIGS. 7A-7D are cross sections to illustrate several intermediate stages of fabricating the image sensor 100 of FIG. 5 according to some embodiments of the disclosure. Referring to FIG. 7A, the semiconductor substrate 101 containing multiple photodiodes 103 formed therein, the wiring layer 121, the high dielectric-constant film 105, the passivation film 107, the light-shielding partition layer 109 and the passivation film 111 are formed in the same way as stated in the above description of FIG. 6A. In this embodiment, there is no patterned buffer layer formed on the passivation film 111.

As shown in FIG. 7A, an R filter 117R, a G filter 117G and a B filter 117B are formed on the passivation film 111 at the R, G and B pixels, 100R, 100G and 100B, respectively. In some embodiments, the R, G and B filters, 117R, 117G and 117B can be formed by a coating and photolithography process. There is an opening 118 formed in the R, G and B filters, 117R, 117G and 117B at the IR pixel 100IR.

Figure 7B:
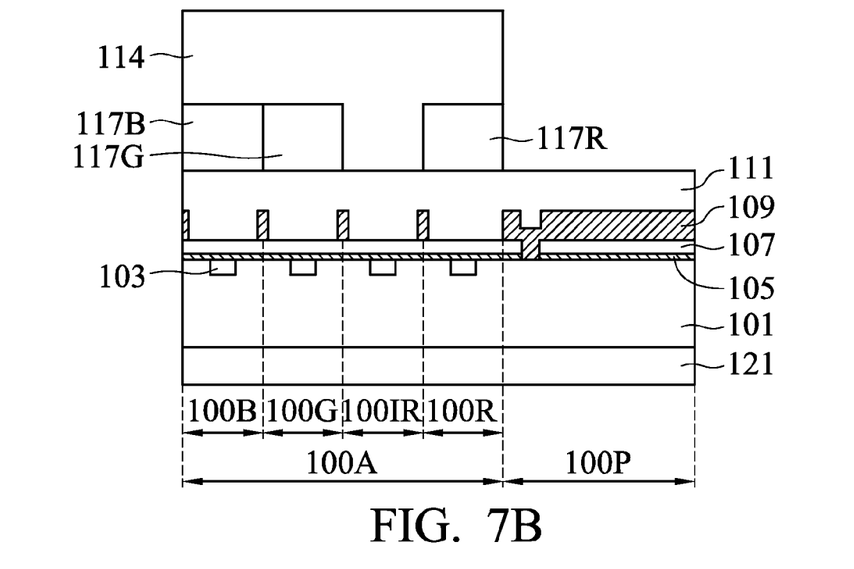

Referring to FIG. 7B, an IR filter material layer 114 is formed on the R, G and B filters, 117R, 117G and 117B and fills in the opening 118 at the IR pixel 100IR. The IR filter material layer 114 can be formed by a coating process.

Figure 7C:
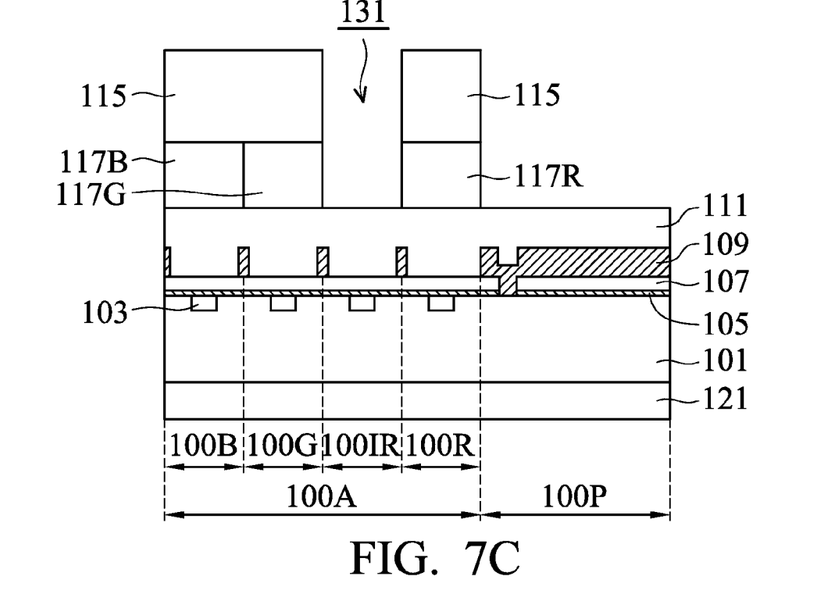
Figure 7D:
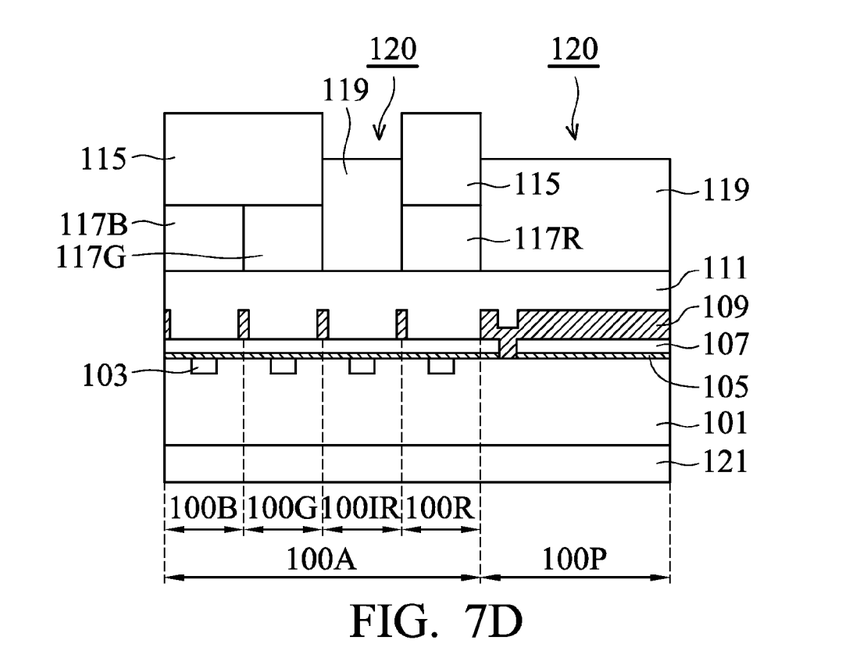

Referring to FIG. 7C, a portion of the IR filter material layer 114 at the IR pixel 100IR is removed by an etching process to form an IR filter 115. Thus, an opening 131 is formed in the IR filter 115 and in the R, G and B filters, 117R, 117G and 117B. As stated in the above description, the IR filter 115 cuts off at least IR light with a specific wavelength. Referring to FIG. 7D, an IR pass filter 119 is formed on the passivation film 111 and fills in the opening 131 of the IR filter 115 and the R, G and B filters, 117R, 117G and 117B at the IR pixel 100IR. Moreover, the IR pass filter 119 is also formed on the passivation film 111 in the peripheral area 100P. In some embodiments, the IR pass filter 119 is formed by a coating process to have a top surface lower than a top surface of the IR filter 115. Thus, there is a cavity 120 formed on the IR filter 115. In some other embodiments, the IR pass filter 119 may be formed to have a top surface level with or higher than a top surface of the IR filter 115.

Next, a microlens structure 123 is formed on the IR filter 115 and the IR pass filter 119. In some embodiments, the cavity 120 is formed on the IR filter 115. Thus, the material of forming the microlens structure 123 also fills in the cavity 120. Then, a double band pass filter 125 is provided to dispose above the microlens structure 123 to complete the image sensor 100 of FIG. 5.

In the embodiments of FIG. 1 and FIG. 5, the image sensors 100 are backside illumination (BSI) image sensors. In some other embodiments, the image sensors of the disclosure can be front-side illumination (FSI) image sensors. In the FSI image sensors, the wiring layer 121 of FIG. 1 and FIG. 5 is transferred to dispose above the photodiodes 103. Moreover, the high dielectric-constant film 105, the passivation film 107, the light-shielding partition layer 109 and the passivation film 111 of FIG. 1 and FIG. 5 can be omitted. The other elements of the FSI image sensors, such as the patterned buffer layer 113, the IR filter 115, the R, G and B filters, 117R, 117G and 117B, the IR pass filter 119, the microlens structure 123 and the double band pass filter 125 can be the same as the BSI image sensors 100 of FIG. 1 and FIG. 5.

While the disclosure has been described by way of example and in terms of the embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. An image sensor, comprising:
a semiconductor substrate containing a plurality of photodiodes formed therein;
a patterned buffer layer disposed above the semiconductor substrate;
a red (R) pixel, a green (G) pixel, a blue (B) pixel and an infrared (IR) pixel;
R, G and B filters respectively disposed at the R, G and B pixels;
an IR pass filter disposed at the IR pixel; and
an IR filter stacked with the R, G and B filters, wherein the IR filter cuts off at least IR light with a specific wavelength, the semiconductor substrate is disposed under the R, G and B filters, the IR filter and the IR pass filter, the R, G and B filters are disposed on the IR filter, the IR filter is formed on the patterned buffer layer, and the patterned buffer layer has an opening at the IR pixel.

2. The image sensor as claimed in claim 1, further comprising a light source unit configured to radiate IR light with a wavelength of a specific band onto an object, wherein the specific wavelength of the IR light cut off by the IR filter is consistent with the wavelength of the specific band of the IR light of the light source unit.

3. The image sensor as claimed in claim 2, wherein the R, G and B filters combined with the IR filter allows R, G and B lights with wavelengths of a visible band to be transmitted through and cuts off the IR light of the light source unit with the wavelength of the specific band.

4. The image sensor as claimed in claim 1, wherein a top surface of the IR pass filter is higher than a top surface of the IR filter.

5. The image sensor as claimed in claim 1, wherein a top surface of the IR pass filter is level with a top surface of the R, G and B filters.

6. The image sensor as claimed in claim 1, wherein the IR filter comprises a selective IR filter cutting off IR light with the specific wavelength.

7. The image sensor as claimed in claim 1, wherein the IR filter comprises an IR cut-off filter cutting off IR light with wavelengths of the entire IR band.

8. The image sensor as claimed in claim 1, further comprising:
 a light source unit configured to radiate IR light with a specific wavelength onto an object;
 a microlens structure disposed above the R, G and B filters, the IR filter and the IR pass filter; and
 a double band pass filter disposed above the microlens structure, wherein the double band pass filter allows a light with a first wavelength of a visible band and a light with a second wavelength of a specific IR band to be transmitted through, and the second wavelength of the specific IR band is consistent with the specific wavelength of the IR light of the light source unit.

9. A method of forming an image sensor, comprising:
 providing a semiconductor substrate containing a plurality of photodiodes formed therein, wherein each of the photodiodes is disposed at one pixel of a red (R) pixel, a green (G) pixel, a blue (B) pixel and an infrared (IR) pixel;
 forming a buffer material layer above the semiconductor substrate;
 forming an IR filter material layer on the buffer material layer;
 removing a portion of the buffer material layer at the IR pixel to form a patterned buffer layer;
 removing a portion of the IR filter material layer at the IR pixel to form an IR filter, wherein the IR filter cuts off at least IR light with a specific wavelength, and the IR filter has an opening at the IR pixel;
 forming R, G and filters respectively at the R, G and B pixels; and
 forming an IR pass filter in the opening of the IR filter at the IR pixel.

10. The image sensor as claimed in claim 1, wherein the R, G and B filters and the IR filter have an opening together, and the IR pass filter fills in the opening of the R, G and B filters and the IR filter.

11. An image sensor, having a pixel array area and a peripheral area surrounding the pixel array area, comprising:
 a red (R) pixel, a green (G) pixel, a blue (B) pixel and an infrared (IR) pixel;
 R, G and B filters respectively disposed at the R, G and B pixels;
 an IR pass filter disposed at the IR pixel; and
 an IR filter stacked with the R, G and B filters, wherein the IR filter cuts off at least IR light with a specific wavelength, the R, G and B filters, the IR filter and the IR pass filter are disposed in the pixel array area, and the IR pass filter is further disposed in the peripheral area as a light shielding element.

12. The image sensor as claimed in claim 11, wherein the R, G and B filters are disposed underneath the IR filter.

13. The image sensor as claimed in claim 11, wherein a top surface of the IR pass filter is lower than the top surface of the IR filter, and a cavity is formed on the IR pass filter.

14. The image sensor as claimed in claim 13, further comprising a microlens structure disposed on the IR filter and the IR pass filter, wherein the microlens structure fills in the cavity formed on the IR pass filter.

\* \* \* \* \*